US010938312B2

(12) United States Patent
Song et al.

(10) Patent No.: US 10,938,312 B2
(45) Date of Patent: Mar. 2, 2021

(54) CONVERTER AND CONTROL METHOD THEREOF

(71) Applicant: DELTA ELECTRONICS, INC., Taoyuan (TW)

(72) Inventors: Hai-Bin Song, Taoyuan (TW); Qi Fu, Taoyuan (TW); Jian Zhou, Taoyuan (TW); Dao-Fei Xu, Taoyuan (TW); Jin-Fa Zhang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/835,331

(22) Filed: Mar. 31, 2020

(65) Prior Publication Data

US 2020/0228021 A1 Jul. 16, 2020

Related U.S. Application Data

(62) Division of application No. 16/246,539, filed on Jan. 13, 2019, now Pat. No. 10,644,606.

(30) Foreign Application Priority Data

Mar. 9, 2018 (CN) .......................... 2018 1 0194211

(51) Int. Cl.
*H02M 3/335* (2006.01)
*H02M 1/088* (2006.01)
(Continued)

(52) U.S. Cl.
CPC ....... *H02M 3/33576* (2013.01); *H02M 1/088* (2013.01); *H03K 5/24* (2013.01);
(Continued)

(58) Field of Classification Search
CPC ......... H02M 3/33507; H02M 3/33561; H02M 3/33569; H02M 3/33515; H02M 3/33576; H02M 3/33592; H02M 3/33523
See application file for complete search history.

(56) References Cited

U.S. PATENT DOCUMENTS 10,141,830 B1 11/2018 Chung et al.
2007/0081599 A1* 4/2007 Yang ................. H02M 3/33523
375/258

(Continued)

FOREIGN PATENT DOCUMENTS

CN 101557171 A 10/2009
CN 101677215 A 3/2010
(Continued)

*Primary Examiner* — Nguyen Tran
(74) *Attorney, Agent, or Firm* — CKC & Partners Co., LLC

(57) ABSTRACT

A converter includes a transformer, a primary side switch, a load detection circuit, a state detection circuit and a control circuit. The transformer is configured to output a voltage to a load. The primary side switch is coupled to a primary winding and a primary ground terminal. The load detection circuit is configured to detect a load state of the load and output a load state signal. The state detection circuit is configured to detect a reference time point. The control circuit is configured to output a control signal to turn on or off the primary side switch. The control circuit further sets a blanking time according to the load state signal, such that the primary side switch is turned on when a drain-source voltage of the primary side switch is at a valley of the resonance after the blanking time starting from the reference time point.

17 Claims, 12 Drawing Sheets

(51) Int. Cl.
    *H03K 5/24*    (2006.01)
    *H02M 1/00*    (2006.01)
    *H02M 1/34*    (2007.01)

(52) U.S. Cl.
    CPC ............ *H02M 2001/0032* (2013.01); *H02M 2001/0054* (2013.01); *H02M 2001/348* (2013.01)

(56) References Cited

U.S. PATENT DOCUMENTS

| | | | |
|---|---|---|---|
| 2008/0278974 A1* | 11/2008 | Wu | H02M 3/33523 363/21.18 |
| 2014/0119065 A1 | 5/2014 | Sugahara et al. | |
| 2016/0261201 A1* | 9/2016 | Tao | H02M 3/33523 |
| 2017/0288554 A1 | 10/2017 | Fahlenkamp et al. | |
| 2018/0019677 A1 | 1/2018 | Chung et al. | |

FOREIGN PATENT DOCUMENTS

| | | |
|---|---|---|
| CN | 103166459 A | 6/2013 |
| CN | 103236795 A | 8/2013 |
| CN | 103414323 A | 11/2013 |
| CN | 103687192 A | 3/2014 |
| CN | 103780063 A | 5/2014 |
| CN | 103812362 A | 5/2014 |
| CN | 103944374 A | 7/2014 |
| CN | 104467431 A | 3/2015 |
| CN | 104734542 A | 6/2015 |
| CN | 104836444 A | 8/2015 |
| CN | 104953835 A | 9/2015 |
| CN | 105262340 A | 1/2016 |
| CN | 105305825 A | 2/2016 |
| CN | 105471270 A | 4/2016 |
| CN | 107612336 A | 1/2018 |
| TW | 497327 B | 8/2002 |

\* cited by examiner

CONVERTER AND CONTROL METHOD THEREOF

CROSS-REFERENCE TO RELATED APPLICATION

The present application is a Divisional Application of the U.S. application Ser. No. 16/246,539, filed Jan. 13, 2019, which claims priority to China Application Serial Number 201810194211.1, filed Mar. 9, 2018, all of which are herein incorporated by reference in their entireties.

BACKGROUND

Technical Field

The present disclosure relates to a converter, especially with regard to a flyback converter.

Description of Related Art

In recent years, switching power supply has been widely applied to portable mobile devices such as laptops, tablet computers, smart phones, and so on. The miniaturization, high efficiency, and high frequency are the trend of switching power supply.

Wherein the flyback converter with QR control mode has been widely used in the low power field, especially applied for the application with power less than 100 W, because of simple circuit structure, low cost, and low switching loss with valley turning on.

However, the conventional QR control mode of flyback converter is not suitable for the development trend of miniaturization and high switching frequency due to the switching loss increased rapidly with high switching frequency. In order to decrease the switching loss, a new control method of flyback converter is provided.

SUMMARY

One aspect of the present disclosure is provided a converter. The converter includes a transformer, a primary side switch, a secondary side switch, a load detection circuit, a state detection circuit and a control circuit. The transformer includes a primary winding and a secondary winding. The primary side switch is electrically coupled to the primary winding and a primary ground terminal. The secondary side switch is electrically coupled to the secondary winding and a load. The load detection circuit is configured to detect a load state and correspondingly output a load state signal. The state detection circuit is configured to detect a reference time point. The control circuit is configured to output a control signal to turn on or turn off the primary side switch. The control circuit is configured to set a blanking time according to the load state signal, such that the primary side switch is turned on when a drain-source voltage of the primary side switch is at a valley of the resonance after the blanking time starting from the reference time point. The transformer further includes a primary auxiliary winding. The state detection circuit is configured to detect a time point when a cross voltage of the primary auxiliary winding starts to oscillate, and sets the reference time point based on the time point.

Another aspect of the present disclosure is a control method of a converter. The control method includes: detecting a load state by a load detection circuit and correspondingly outputting a load state signal; setting a blanking time by a control circuit according to the load state signal; detecting a reference time point by a state detection circuit; outputting a control signal to a primary side switch of the converter by the control circuit so as to turn on the primary side switch when a drain-source voltage of the primary side switch is at a valley of the resonance after the blanking time starting from the reference time point. Wherein the control method further includes: detecting a time point when a cross voltage of the a primary auxiliary winding of a transformer starts to oscillate; and setting the reference time point based on the time point.

Another aspect of the present disclosure is provided a converter. The converter includes a transformer, a primary side switch, a secondary side switch, a load detection circuit, a state detection circuit and a control circuit. The transformer includes a primary winding and a secondary winding. The primary side switch is electrically coupled to the primary winding and a primary ground terminal. The secondary side switch is electrically coupled to the secondary winding and a load. The load detection circuit is configured to detect a load state and correspondingly output a load state signal. The state detection circuit is configured to detect a reference time point. The control circuit is configured to output a control signal to turn on or turn off the primary side switch. The control circuit is configured to set a blanking time according to the load state signal, such that the primary side switch is turned on when a drain-source voltage of the secondary side switch is at a peak value of a resonance after the blanking time starting from the reference time point. The state detection circuit is configured to detect a time point when the drain-source voltage of the secondary side switch starts to oscillate, and sets the reference time point based on the time point.

Another aspect of the present disclosure is a control method of a converter. The control method includes: detecting a load state by a load detection circuit and correspondingly outputting a load state signal; setting a blanking time by a control circuit according to the load state signal; detecting a reference time point by a state detection circuit; and outputting a control signal to a primary side switch of the converter by the control circuit so as to turn on the primary side switch when a drain-source voltage of the secondary side switch is at a peak value of a resonance after the blanking time starting from the reference time point; wherein the control method further includes: detecting the drain-source voltage of a secondary side switch of a secondary side rectifier circuit of the converter by the state detection circuit; and recording the reference time point based on a time point when the drain-source voltage of the secondary side switch starts to oscillate.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

Figure 3:
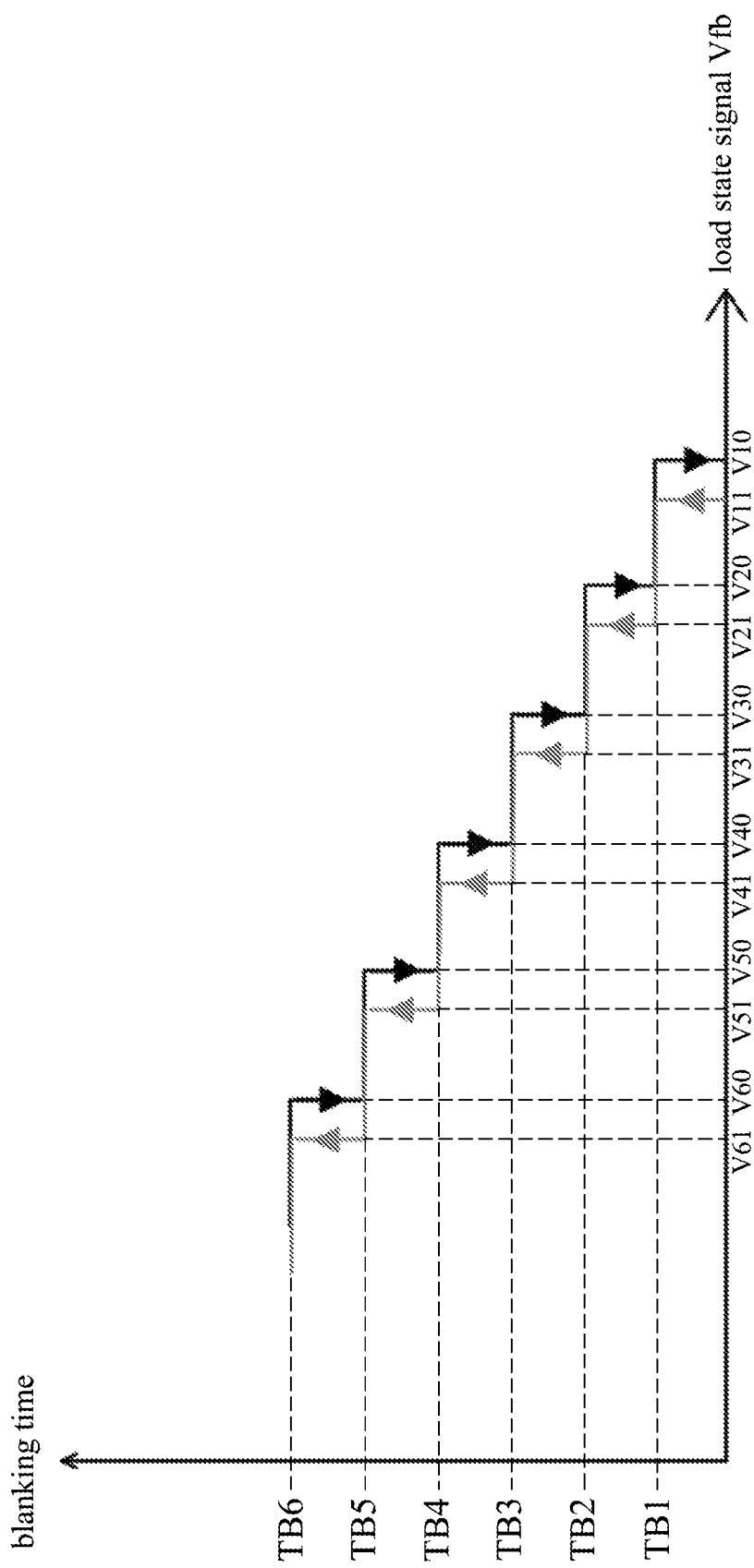

FIG. 3 is a schematic diagram of the relation chart between the load state signal and the length of the blanking time in some embodiments of the present disclosure.

Figure 4A:
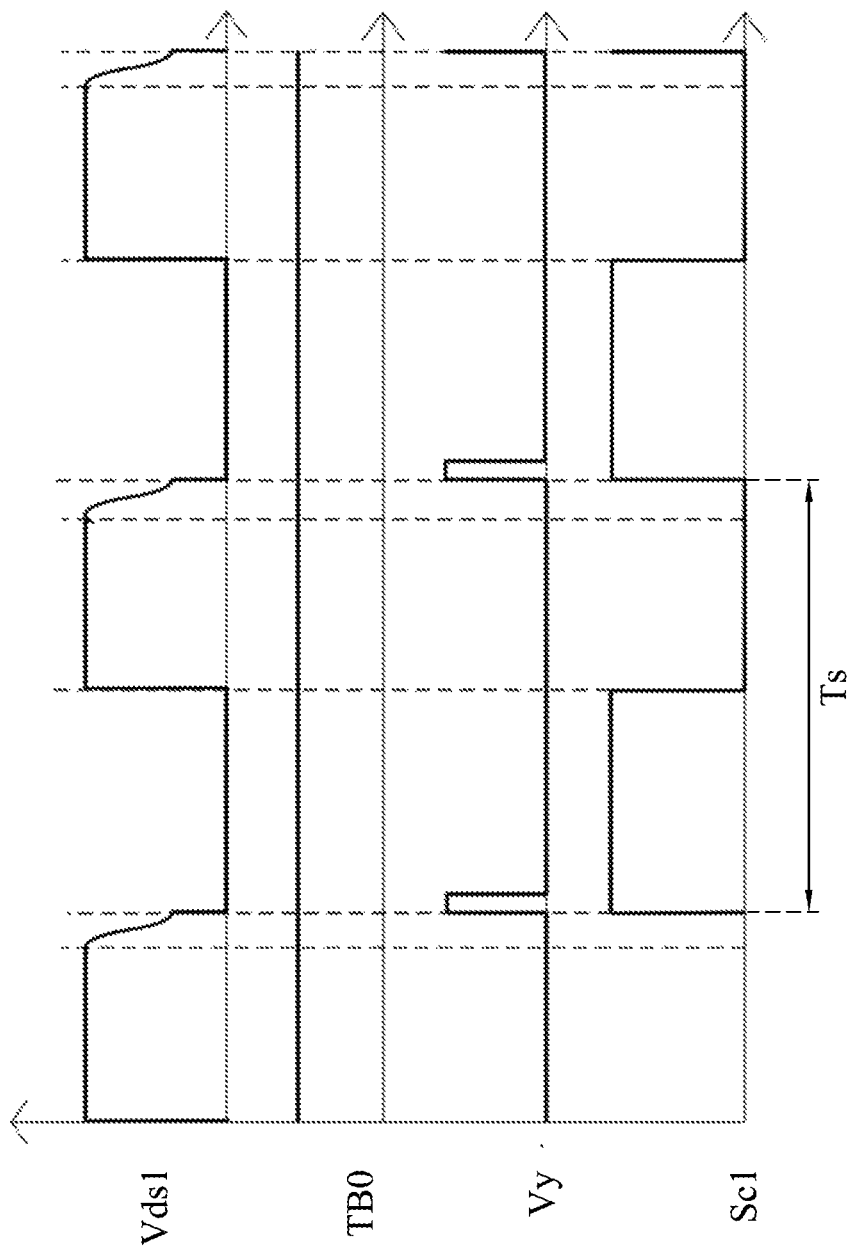

FIG. 4A is a schematic diagram of the waveforms of the heavy load in some embodiments of the present disclosure.

Figure 4B:
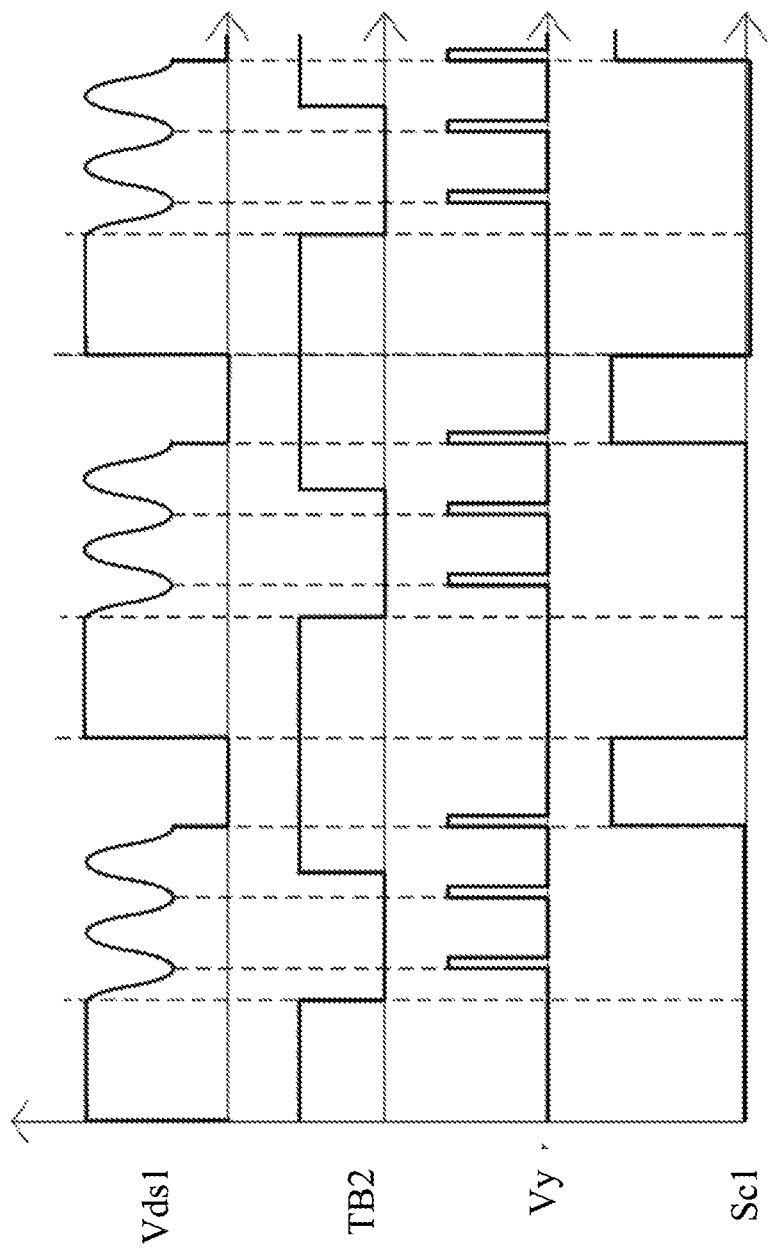

FIG. 4B is a schematic diagram of the waveforms of the medium load in some embodiments of the present disclosure.

Figure 4C:
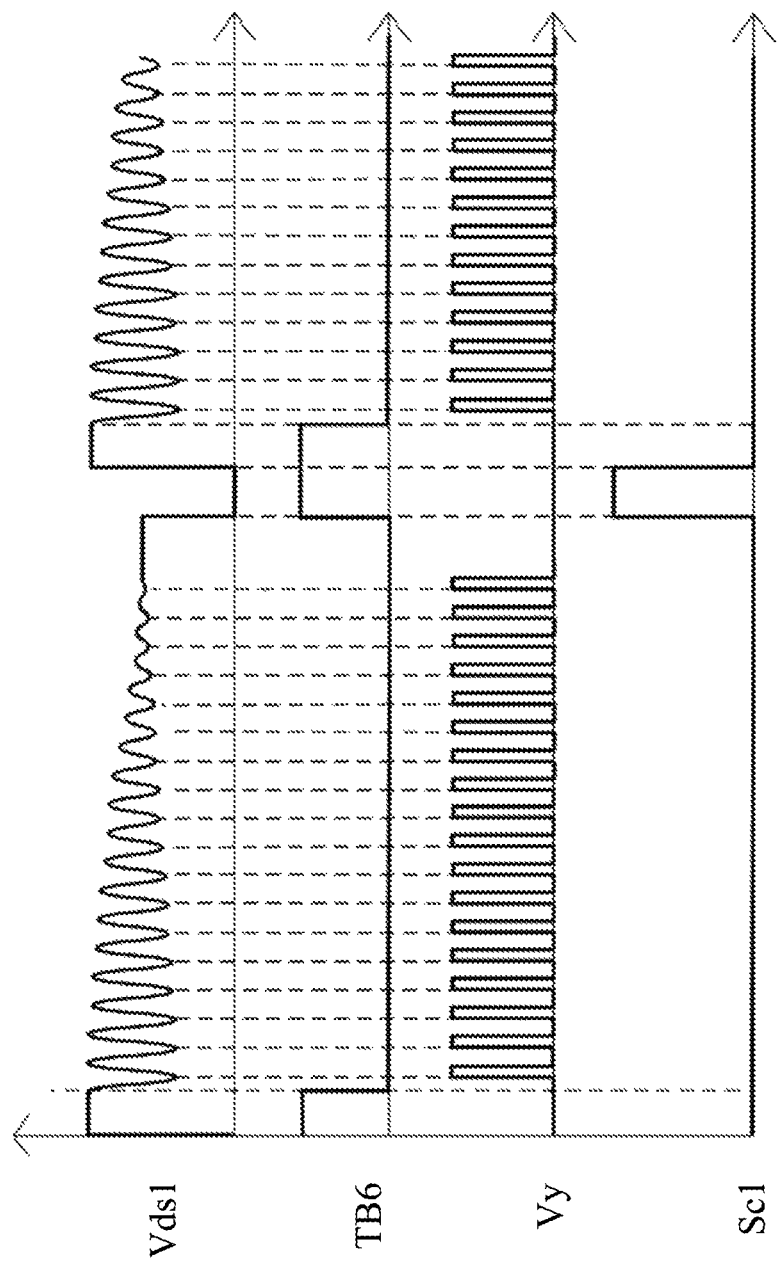

FIG. 4C is a schematic diagram of the waveforms of the light load in some embodiments of the present disclosure.

Figure 5:
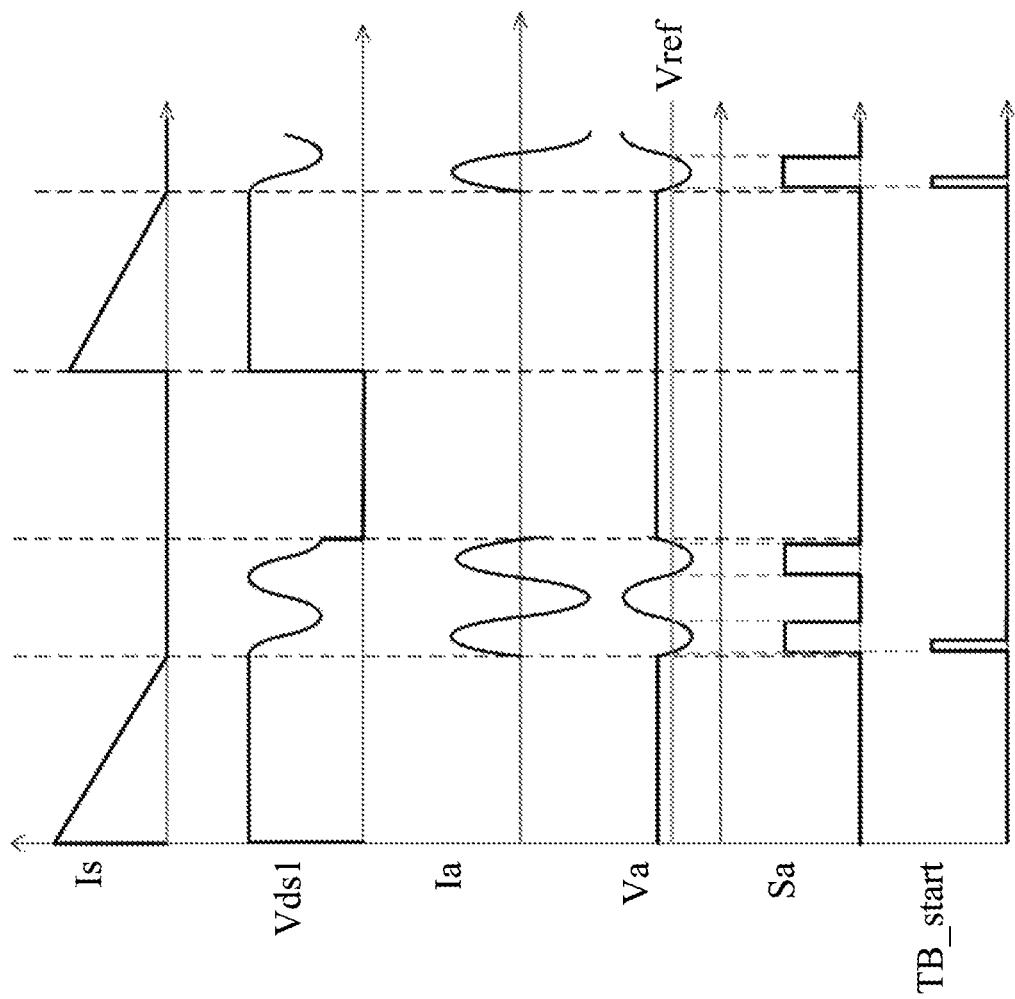

FIG. 5 is a schematic diagram of voltage and current waveforms of the converter in some embodiments of the present disclosure.

Figure 6:
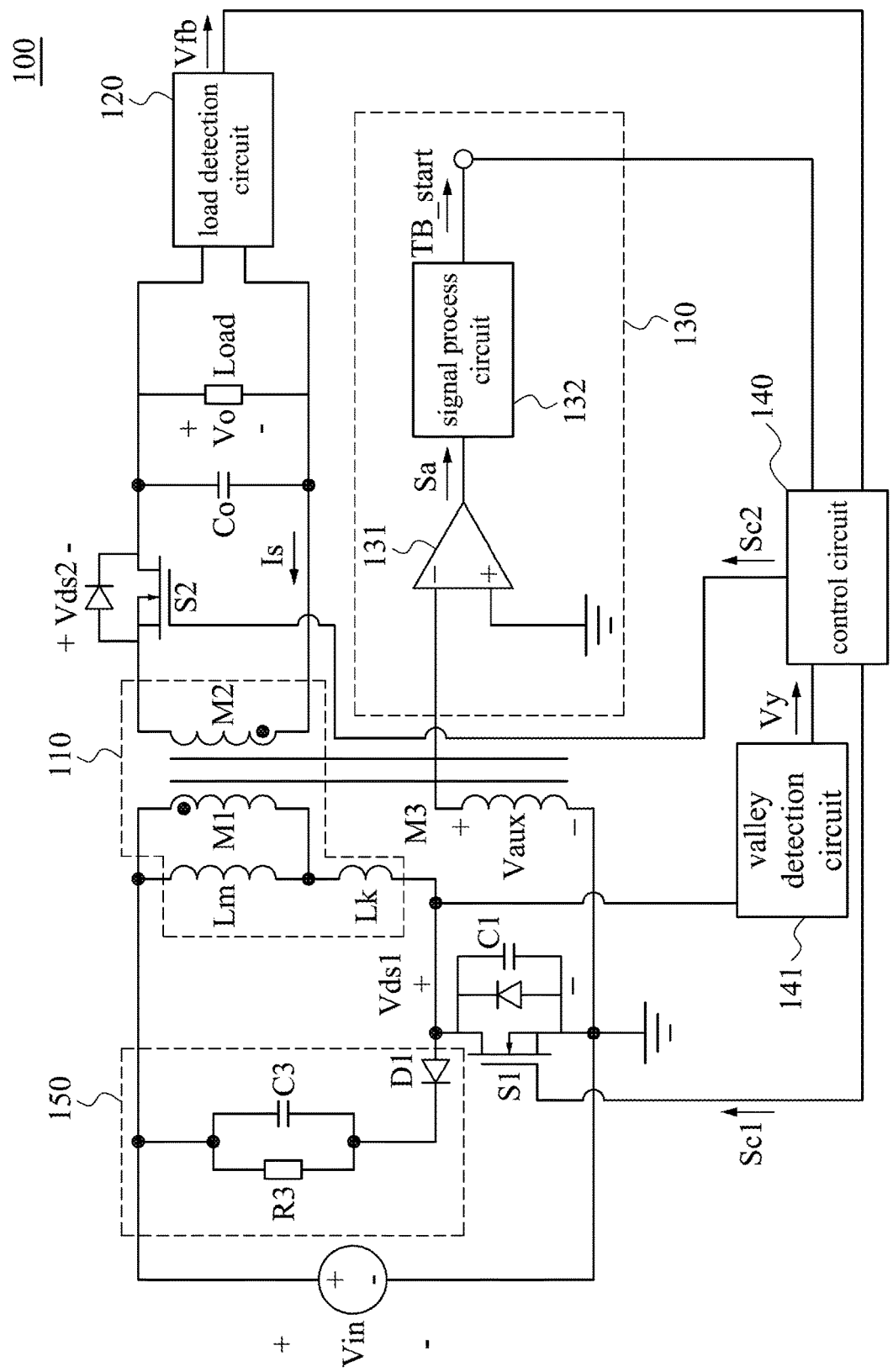

FIG. 6 is a schematic diagram of a converter in some embodiments of the present disclosure.

Figure 7:
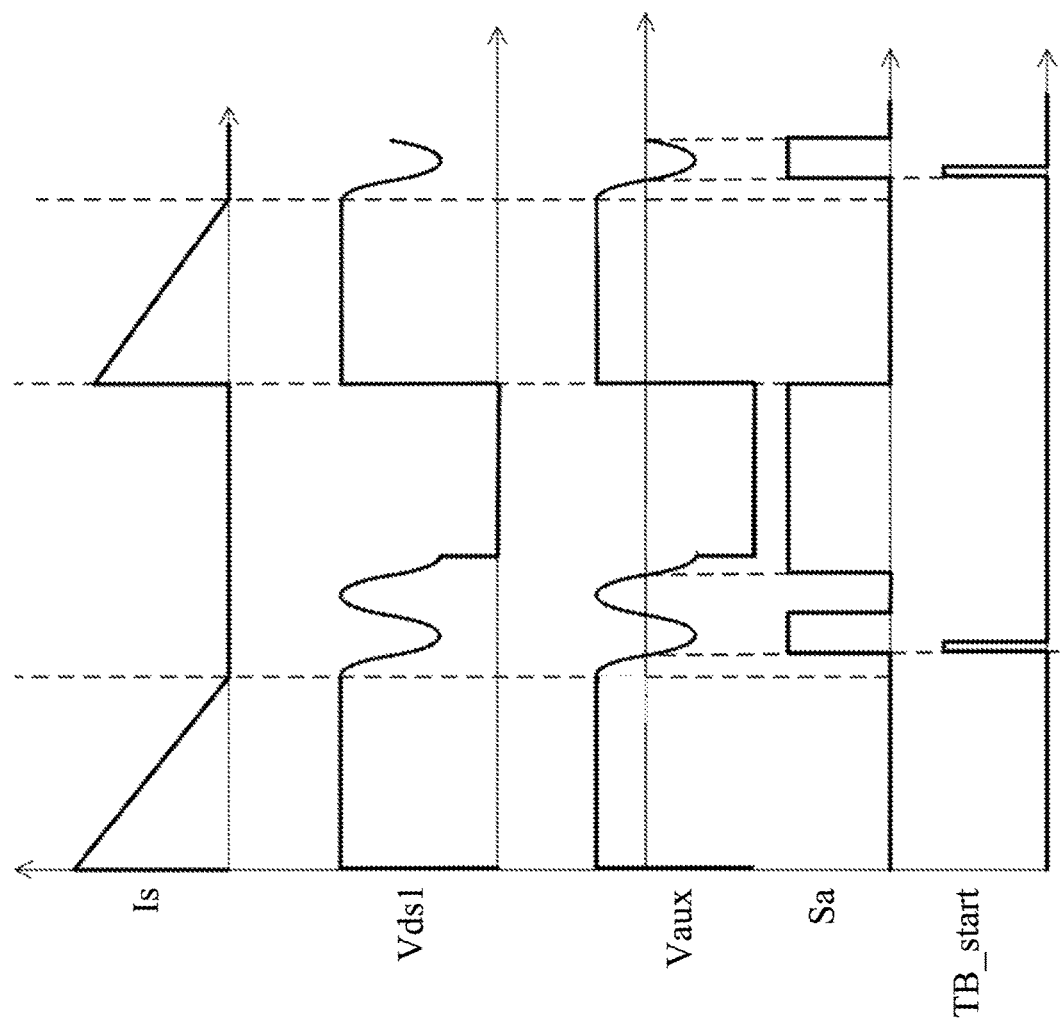

FIG. 7 is waveforms of the secondary side current Is, the drain-source voltage Vds1 of the primary side switch, the cross voltage Vaux of the primary auxiliary winding, trigger signal Sa and start signal TB_start in some embodiments of the present disclosure.

Figure 8:
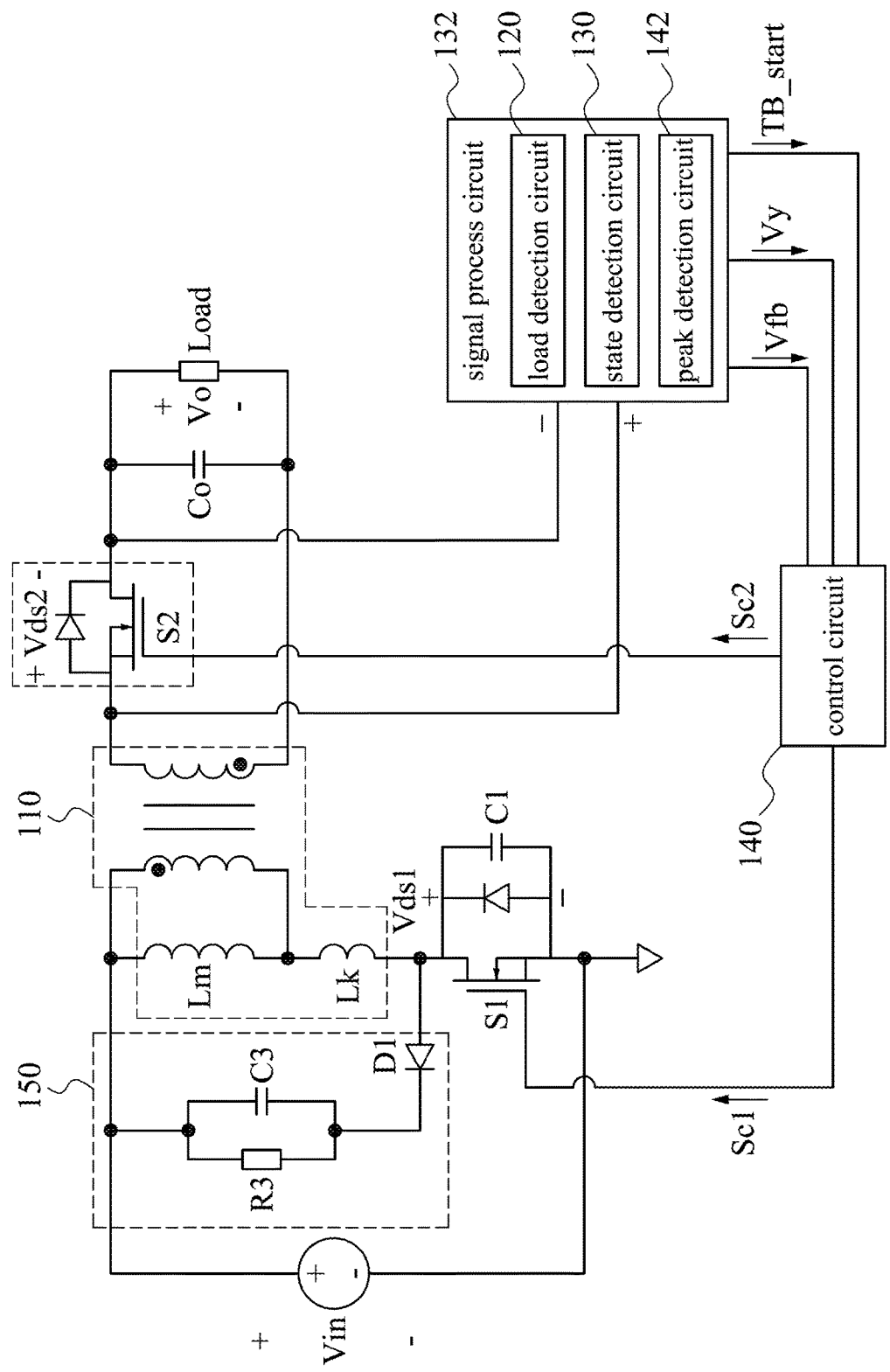

FIG. 8 is a schematic diagram of a converter in some embodiments of the present disclosure.

Figure 9:
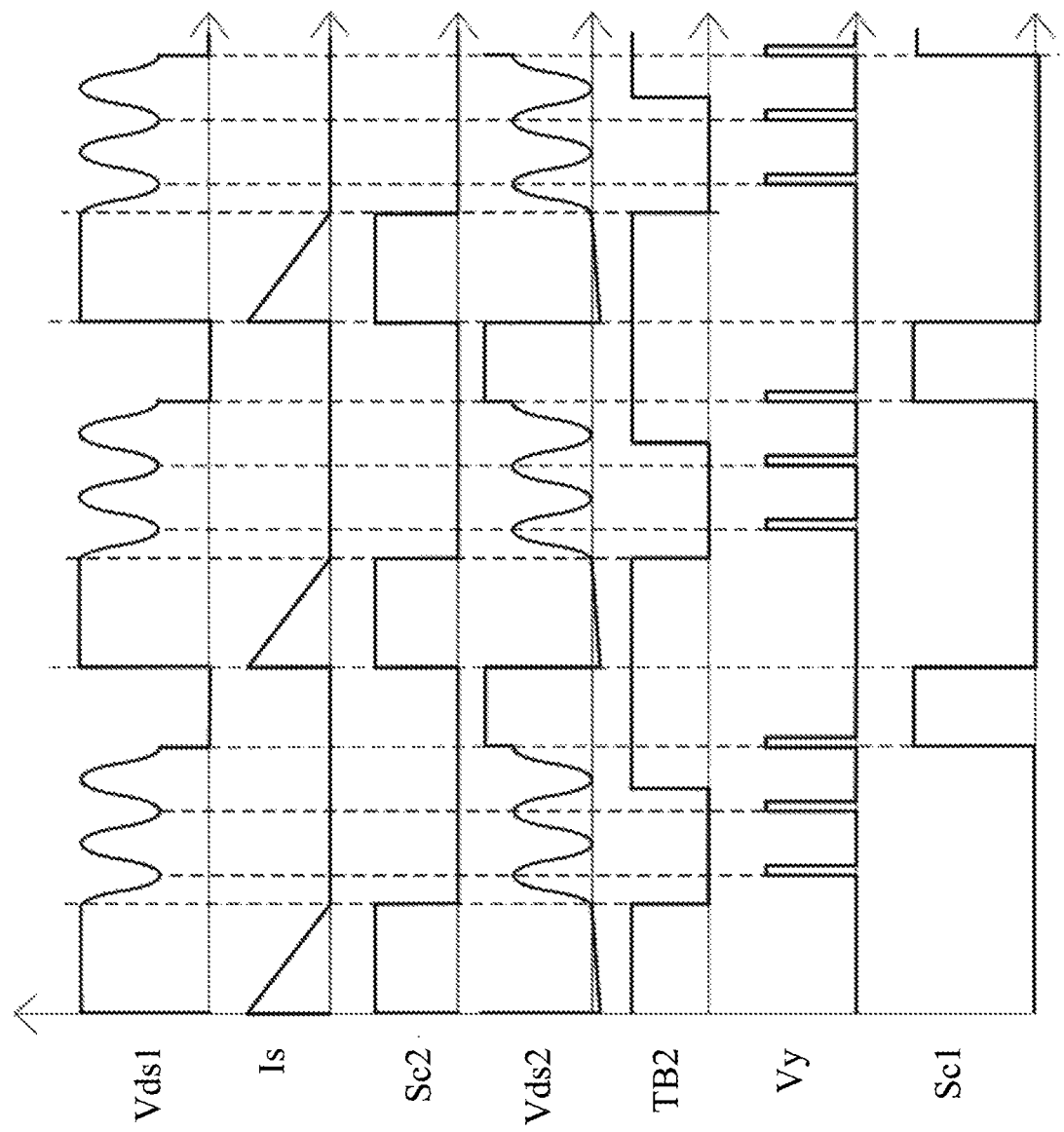

FIG. 9 is waveforms of the first control signal Sc1, the drain-source voltage Vds1 of the primary side switch, the secondary side current Is, the second control signal Sc2, the drain-source voltage Vds2 of the secondary side switch and turn on signal Vy in some embodiments of the present disclosure.

Figure 10:
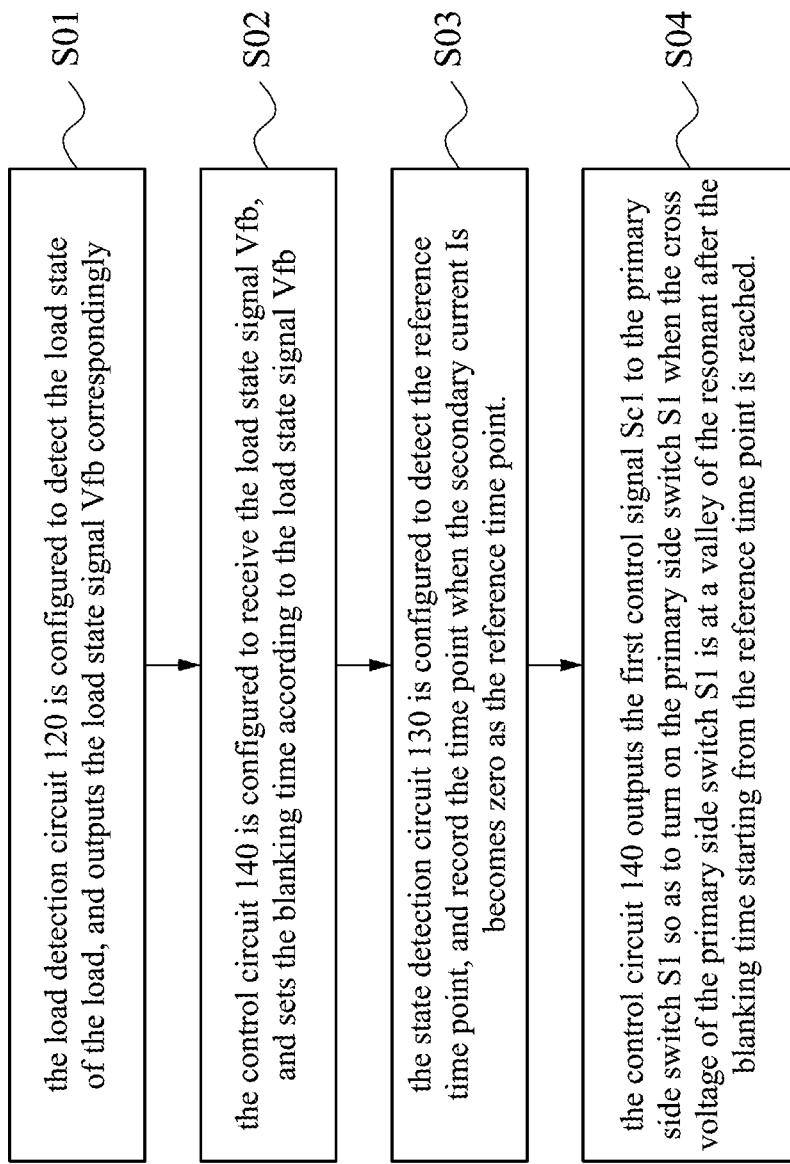

FIG. 10 is a flowchart illustrating a control method in some embodiments of the present disclosure.

DETAILED DESCRIPTION

For the embodiments below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be termed "electrically connected to" or "electrically coupled to", and it can be directly connected or coupled to the other element or intervening elements. As used herein, the term "and/or" includes an associated listed items or any and all combinations of more. In addition, although terms such as "first", "second" are used to describe different elements, it should be understood that such words are used to distinguish elements or operations which are described using the same terminology. Unless otherwise stated, such words are not intended to imply any specific order or sequence or to limit the scope of the present disclosure.

Figure 1:
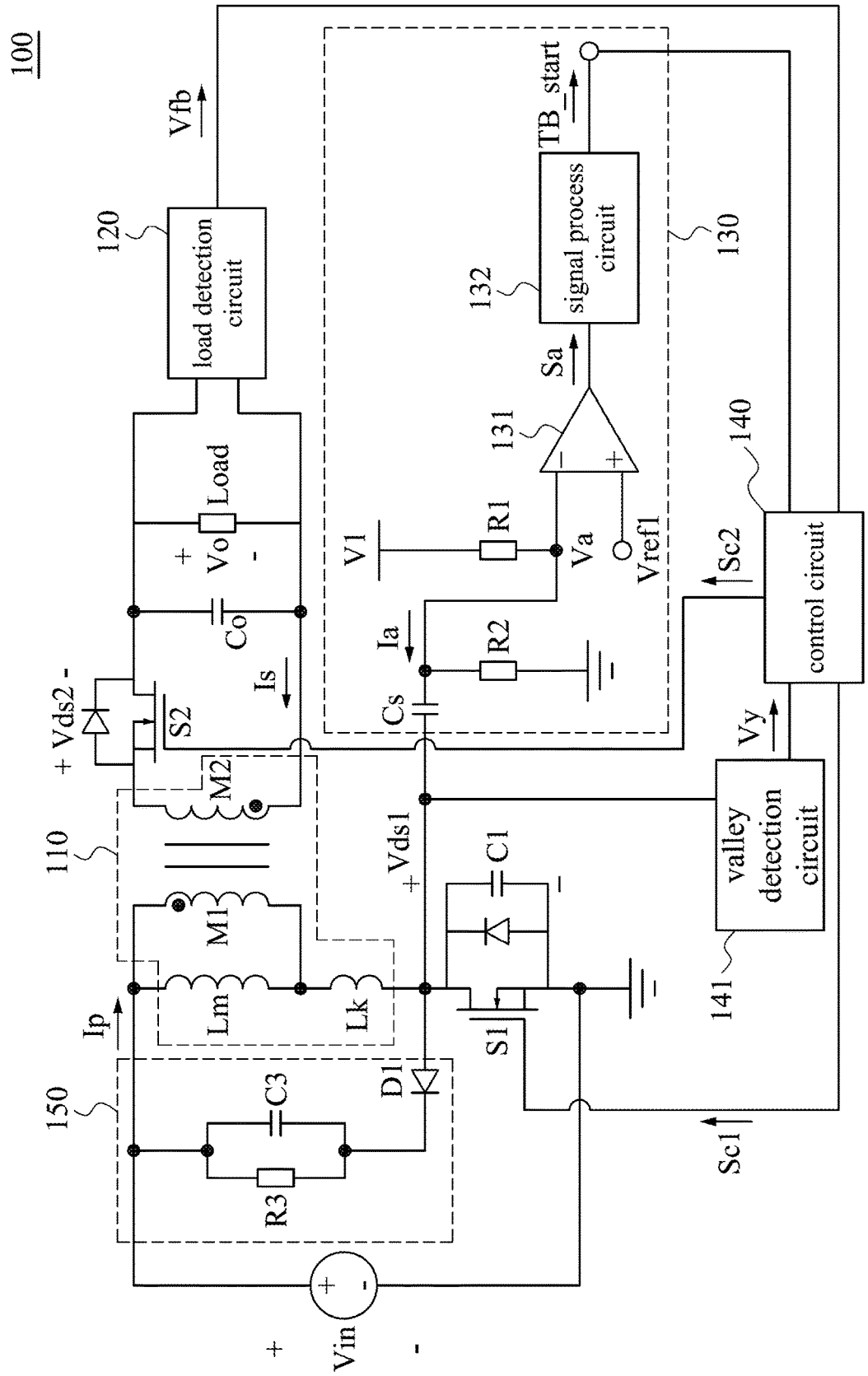
FIG. 1 is a schematic diagram of a converter in some embodiments of the present disclosure.

Referring to FIG. 1, the converter 100 is configured to convert an input voltage Vin received from an input voltage source into an output voltage Vo. In some embodiments, the converter 100 may be a flyback converter, but the present disclosure is not limited thereto.

As shown in FIG. 1, the converter 100 includes transformer 110, a primary side switch S1, a load detection circuit 120, a state detection circuit 130 and a control circuit 140. The transformer 110 includes a primary winding M1 and a secondary winding M2. The transformer 110 is configured to transmit the received power from the primary winding M1 to the secondary winding M2. Structurally, the first terminal of the primary winding M1 is electrically coupled to the positive terminal of the input voltage Vin. The second terminal of the primary winding M1 of the transformer 110 is electrically coupled to the first terminal of the primary side switch S1. The second terminal of the primary side switch S1 is electrically coupled to a primary ground terminal (or negative terminal of input voltage Vin). In other words, the primary side switch S1 is electrically coupled between the primary winding M1 and the primary ground terminal. The control terminal of the primary side switch S1 is configured to receive a first control signal Sc1 to turn on or turn off the primary side switch S1. For example, the primary side switch S1 turns on when the first control signal Sc1 has a first level (e.g., high level). Relatively, the primary side switch S1 turns off when the first control signal Sc1 has a second level (e.g., low level).

Further, the converter 100 includes a secondary side rectifier circuit. As shown in FIG. 1, the secondary side rectifier circuit includes a secondary side switch S2, and the secondary side switch S2 is connected between the secondary winding M2 and load. Further, the secondary side switch S2 is electrically coupled to the first terminal of the secondary winding M2 and the first terminal of the output capacitance Co. In some other embodiments, the secondary side switch S2 can be arranged between the second terminal of the secondary winding M2 and the second terminal of the output capacitance Co. The control terminal of the secondary side switch S2 receives a second control signal Sc2 to control the secondary side switch S2 on or off. Wherein, the secondary side switch S2 may be MOSFET, IGBT or GaN devices. In some other embodiments, the secondary side switch S2 may be a diode or other components.

Specifically, when the primary side switch S1 is turned on, a primary side current Ip flows through the primary winding M1 of the transformer 110, and correspondingly stores the energy in the transformer 110. At this time, the polarity of the secondary winding M2 of the transformer 110 is opposite to the polarity of the primary winding M1, and the secondary side switch S2 is off. No current flows through the secondary side switch S2, and no energy is transferred from the primary winding M1 to the secondary winding M2. The energy received by the load is provided by the output capacitor Co.

Relatively, when the primary side switch S1 is turned off, the polarity of the windings will reverse. At this time, the secondary side switch S2 conducts so as to the energy of the transformer 110 transfers to the secondary winding M2 from the primary winding M1 and forms a secondary side current Is. The secondary side current Is flows through the secondary side switch S2, such that the energy stored in the transformer 110 transmits to the load and output capacitance Co through the secondary side switch S2.

When the energy of the transformer 110 is transferred to the load and the output capacitance Co, the secondary side current Is is gradually decreased. When the secondary side current Is drops to zero, the parasitic capacitance C1 of the primary side switch S1 will resonate with magnetizing inductance Lm, resulting in corresponding oscillation of the drain-source voltage Vds1 of the primary side switch S1. Then, the primary side switch S1 of the converter turns on through the first control signal Sc1 again, so that the primary side current Ip flows through the primary winding M1 to store energy to the transformer 110. Accordingly, by repeatedly controlling turn on or turn off of the primary side switch S1 and the secondary side switch S2, the converter 100 can convert the input voltage Vin into the output voltage Vo.

In order to decrease the switching loss, the optimal time to turn on the primary side switch S1 is when the drain-source voltage Vds1 of the primary side switch S1 at valley of the resonance. In the present disclosure, the state detection circuit 130 is configured to detect a reference time point. The reference time point is corresponding to a time point when the secondary current Is in the secondary winding M2 drops to zero. The load detection circuit 120 is configured to detect the state of the load, and correspondingly outputs a load state signal Vfb. The control circuit 140 confirms the present load state of the converter 100 is in a light load state, a medium load state or a heavy load state according to the load state signal Vfb so as to set a blanking time. Then the control circuit 140 outputs a first control signal Sc1 to turn on the primary side switch S1 when the drain-source voltage Vds of the primary side switch is at a valley of the resonance after the blanking time starting from the reference time point.

Accordingly, since the control circuit 140 sets the blanking time according to the load state, and the blanking time is not affected by the switching frequency of the primary side switch S1. The converter control method of the present disclosure is compatible with the converter 100 with any switching frequencies design.

According to one aspects of the present application, the converter 100 includes a clamp circuit 150 which includes a clamp resistor R3, a clamp capacitance C3 and a diode D1. The clamp circuit 150 is parallel to the primary winding M1 and configured to clamp the drain-source voltage Vds1 of the primary side switch S1 when the primary side switch S1 is turned off.

Figure 2:
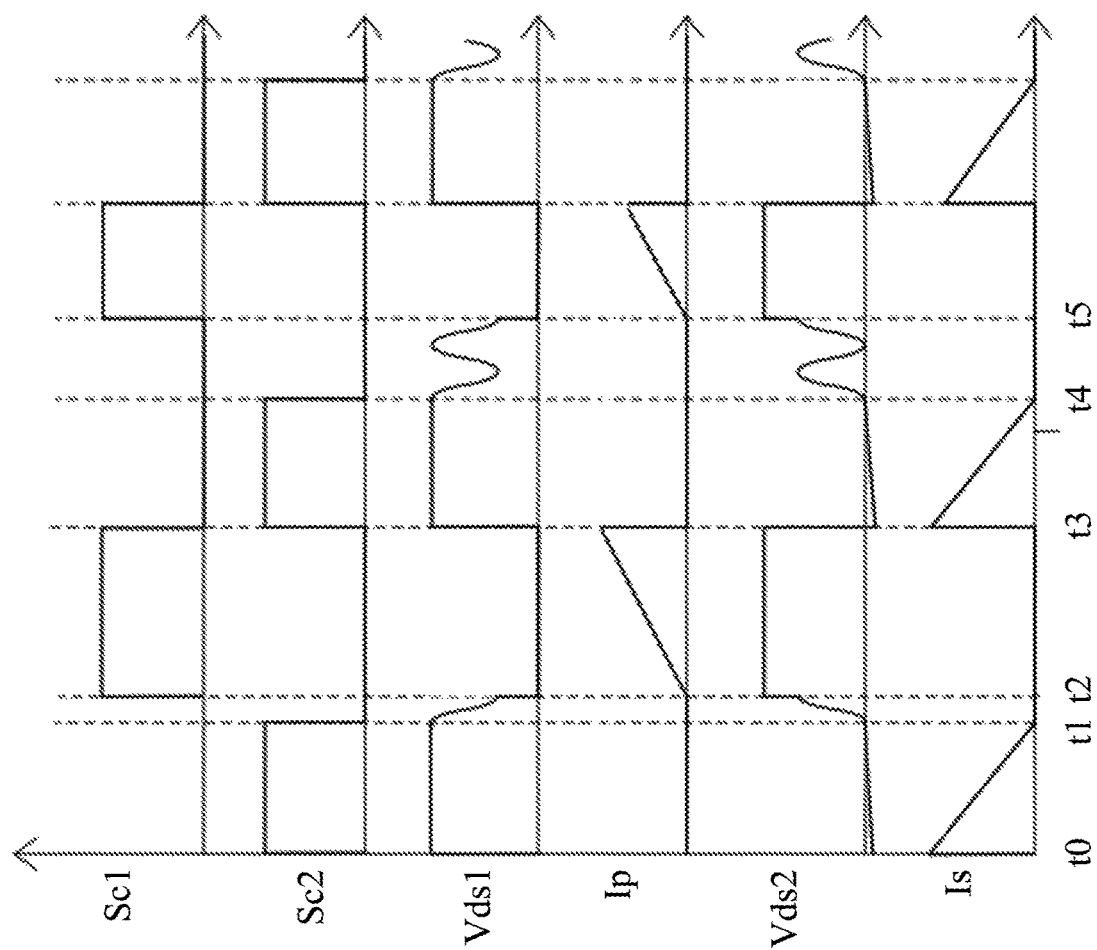
FIG. 2 is waveforms of the first control signal Sc1, the second control signal Sc2, the primary side current Ip, the secondary side current Is, the drain-source voltage Vds1 of the primary side switch, and the drain-source voltage Vds2 of the secondary side switch of the converter in some embodiments of the present disclosure.

Referring to FIG. 2, similar elements related to the embodiment of FIG. 1 are assigned with the same reference numerals for better understanding. For convenience and clarity, the waveforms of the first control signal Sc1, the second control signal Sc2, the primary side current Ip, the secondary side current Is, and the drain-source voltage Vds1 of the primary side switch S1 of the converter 100 shown in FIG. 2 will be described with the embodiments shown in FIG. 1, but not limited thereto.

At the time point t0, the secondary side switch S2 is turned on. During the time t0 to t1, the converter 100 is in the state of transferring energy to the load from the transformer 110, and the secondary current Is decreases gradually. At the time point t1, the secondary current Is drops to zero, and the first control signal Sc1, the second control signal Sc2 both are keeping low level, and the secondary side switch S2 is turned off. The drain-source voltage Vds1 of the primary side switch S1 starts to oscillate. Therefore, the time point t1 is the "reference time point" described above.

During the time t0 to t1, if the load detection circuit 120 detects that the converter 100 is in heavy load, the control circuit 140 will set the blanking time equal to zero. When the control circuit 140 detects that the drain-source voltage Vds1 of the primary side switch starts to oscillate and at a valley of the resonance for the first time (time point t2), the control circuit 140 outputs the first control signal Sc1 (e.g., becomes to high level) to turn on the primary side switch S1. During the time t2-t3, the first control signal Sc1 is in high level and the primary side switch S1 is turned on so as to allow the primary current Ip flows through the primary winding M1 and primary side switch S1. Therefore, the drain-source voltage Vds1 of the primary side switch S1 is zero.

At the time point t3, the first control signal Sc1 switches from high level to low level. Correspondingly, the primary side switch S1 is turned off and the primary current Ip becomes zero. During the time t3-t4, the secondary current Is flows through the secondary side switch S2. As the energy stored on the transformer 110 is transferred to the load, the secondary current Is will gradually decrease from its maximum value to zero.

In some embodiments, for example, if the load detection circuit 120 detects that the converter 100 is in medium load. Starting from the time point t4, the control circuit 140 sets a blanking time. After the blanking time, when the drain-source voltage Vds1 of the primary side switch S1 is at a valley of the resonance again (e.g., the time point t5 in FIG. 2), the control circuit 140 generates the first control signal Sc1 to turn on the primary side switch S1 again. The above time points t2-t5 may be considered as one of the working period of the converter 100. By repeatedly controlling the primary side switch S1 and the secondary side switch S2 to turn on or turn off, the converter 100 can convert the input voltage Vin into the output voltage Vo and output it to the load.

Specifically, the converter 100 sets different length of the blanking time according to the load state signal Vfb. Wherein, the length of the blanking time increases as the load state decreases. That is, there is negative correlation between the blanking time and the magnitude of the load state signal. For example, the converter 100 may work in the heavy load state, the medium load state and the light load state. When the converter 100 is in the heavy load state, the control circuit 140 selects a heavy load time as the blanking time. When the converter 100 is in the medium load state, the control circuit 140 select a medium load time as blanking time. The medium load time is longer than the heavy load time. When the converter 100 is in light load state, the control circuit 140 selects a light load time as the blanking time. The light load time is longer than the medium load time. When the converter 100 is in very light load, the control circuit 140 generates a turn on signal to turn on the primary side switch S1 after a longer blanking time starting from the reference time point without considering the valley.

Referring to FIG. 3, FIG. 3 is the relation chart between the load state signal Vfb and the length of the blanking time in some embodiments of the present disclosure, wherein the horizontal axis is the load state signal Vfb which represents the load state of the converter 100. The vertical axis is the blanking time which represents the length of blanking time that should be set. As shown in FIG. 3, the characteristic line of relation chart is like a ladder. There are multiple corresponding critical values V10, V11, V21, V20-V60, V61 on the horizontal axis and multiple corresponding blanking times TB1-TB6 on the vertical axis.

The control circuit 140 adjusts the length of blanking time along with the trend of the ladder shaped relationship line. For example, as shown in FIG. 3, when the load state signal Vfb decrease to the critical value V21, the control circuit 140 adjusts the blanking time from TB1 to TB2. When the load state signal Vfb increase to the critical value V20, the control circuit 140 return the blanking time from TB2 to TB1.

The heavier load state (e.g., the load state signal Vfb become larger), the shorter blanking time. In other words, the lighter load state (e.g., the load state signal Vfb becomes smaller), the longer blanking time. In this way, the control circuit 140 can adjust the length of the blanking time, according to the magnitude of the load state signal Vfb.

Referring to FIG. 4A-4C, FIG. 4A-4C are waveforms of drain-source voltage Vds1 of the primary side switch S1, blanking signal TBx, turn on signal Vy, and the first control signal Sc1 of the converter 100 in the "heavy load state", "medium load state" and "light load state". As shown in FIG. 4A, the blanking time is zero in the heavy load state, so that the blanking signal TB0 in the control circuit 140 maintains to high level. When the control circuit 140 detects that the drain-source voltage Vds1 of the primary side switch S1 is at a valley of the resonance, the control circuit 140 generates the first control signal Sc1 to turn on the primary side switch S1. In some embodiments, the control circuit 140 detects the drain-source voltage Vds1 of the primary side switch S1 by a valley detection circuit 141. When detecting that the drain-source voltage Vds1 of the primary side switch S1 is at a valley of the resonance, the control circuit 140 generates a turn on signal Vy to the control circuit 140.

Similarly, as shown in FIG. 4B, in the medium load state, the control circuit 140 sets the blanking signal TB2 to low level from the reference time point, and during the time when the blanking signal TB2 is low level, the turn on signal Vy does not work. After the blanking time starting from the reference time point, the control circuit 140 sets the blanking signal TB2 to high level. At this time, when the valley detection circuit 141 detects that the drain-source voltage Vds1 of the primary side switch S1 is at a valley of the resonance, the control circuit 140 outputs the first control signal Sc1 (e.g., becomes to high level) to turn on the primary side switch S1. As shown in FIG. 4C, in the very light load state, the control circuit 140 directly generates the turn on signal Sc1 to turn on the primary side switch S1 after a longer blanking time starting from the reference time point without considering the turn on signal Vy.

Referring to the FIG. 1-5, when the secondary current Is becomes zero, the drain-source voltage Vds1 of the primary side switch S1 starts to oscillate at the same time. Therefore, in some embodiments, the state detection circuit 130 detects the drain-source voltage Vds1 of the primary side switch S1 and records the time point when the drain-source voltage Vds1 of the primary side switch S1 starts to oscillate as the reference time point.

According to one aspects of the present application, the state detection circuit 130 includes a sensing capacitor Cs and a comparator 131. The first terminal of the sensing capacitor Cs is electrically coupled to the primary winding M1 and the primary side switch S1. The second terminal of the sensing capacitor Cs is electrically coupled to the first terminal of the comparator 131. The first terminal of the comparator 131 is further electrically coupled to a voltage source V1 through a resistor R1, and electrically coupled to a ground terminal through a resistor R2. The second terminal of the comparator 131 is electrically coupled to a reference voltage Vref1. In some embodiments, the state detection circuit 130 further includes a signal process circuit 132. The signal process circuit 132 is connected to the output terminal of the comparator 131. When the drain-source voltage Vds1 of the primary side switch S1 starts to oscillate, the sensing capacitor generates corresponding voltage change and current change. The current Ia will flow through the sensing capacitor Cs. When the voltage Va decreases and is less than the reference voltage Vref1, the comparator 131 outputs a trigger signal Sa to the signal process circuit 132, and the signal process circuit 132 outputs the start signal TB_start to the control circuit 140 according to the trigger signal Sa.

Referring to FIG. 6, FIG. 6 is a schematic diagram of a converter 100 in some embodiments of the present disclosure. In FIG. 6, similar elements related to the embodiment of FIG. 1 are assigned with the same reference numerals for better understanding. The specific principles of similar elements have been described in detail in the previous paragraphs, it will not be described herein.

As shown in FIG. 6, the transformer 110 further includes a primary auxiliary winding M3 and the state detection circuit 130 includes a comparator 131. The two terminals of the primary auxiliary winding M3 respectively connect to the first input terminal of the comparator 131 and the primary ground terminal, and the second terminal of the comparator 131 is connected to the primary ground terminal. In some embodiments, the state detection circuit 130 further includes a signal process circuit 132. The signal process circuit 132 is connected to the output terminal of the comparator 131. As shown in FIG. 7, when the secondary current Is becomes zero, the drain-source voltage Vds1 of the primary switch S1 and the cross voltage Vaux of the primary auxiliary winding M3 start to oscillate at the same time. When the cross voltage Vaux of the primary auxiliary winding M3 starts to oscillate and cross zero voltage, the comparator 131 outputs a trigger signal Sa to the signal process circuit 132. Then, the signal process circuit 132 outputs the start signal TB_start to the control circuit 140 to record the reference time point. The reference time point is the time point when the cross voltage Vaux cross zero voltage. In some embodiments, the second terminal of the comparator 131 is connected to a reference voltage Vref2, when the cross voltage Vaux of the primary auxiliary winding M3 starts to oscillate and cross the reference voltage Vref2, the comparator 131 outputs a trigger signal Sa to the signal process circuit 132.

In some embodiments, the state detection circuit 130 is also configured to detect the drain-source voltage Vds2 of the secondary side switch S2 and records the time point when the drain-source voltage Vds2 of the secondary side switch S2 starts to oscillate as the reference time point. Referring to FIG. 8 and FIG. 9, the converter 100 includes a signal process circuit 132, and the load detection circuit 120, the state detection circuit 130 and the peak detection circuit 142 are integrated in the signal process circuit 132. The signal process circuit 132 is electrically coupled to the two terminals of the secondary side switch S2 so as to detect the drain-source voltage Vds2 of the secondary side switch S2. The load detection circuit 120, the state detection circuit 130 and the peak detection circuit 142 may respectively output corresponding load state signal Vfb, start signal TB_start and turn on signal Vy according to the drain-source voltage Vds2 of the secondary side switch S2.

Further, the state detection circuit 130 is electrically coupled to the two terminals of the secondary side switch S2 to detect the drain-source voltage Vds2 of the secondary side switch S2. As shown is FIG. 9, when the secondary current Is becomes zero, the drain-source voltage Vds2 of the secondary side switch S2 starts to oscillate correspondingly and the oscillating phase is opposite to the drain-source voltage Vds1 of the primary side switch S1. By detecting the time when the drain-source voltage Vds2 of the secondary side switch S2 starts to oscillate, the state detection circuit 130 outputs the start signal TB_start through the signal processing circuit 132 to record the reference time point. In some other embodiments, the state detection circuit 130 is electrically coupled to the secondary side switch S2 so as to detect the time point when the secondary current Is of the secondary winding becomes zero, and record the time point when the secondary current Is of the secondary winding becomes zero as the reference time point.

The connection relationship and the specific structure of the load detection circuit 120 are not the limitations of the present disclosure. One skilled in the art can understand the configuration of the load detection circuit 120 and therefore will not be described here. In some embodiments, as shown in FIG. 8 and FIG. 9, the load detection circuit 120 detects the negative peak value of the drain-source voltage Vds2 of the secondary side switch S2, and outputs the load state signal Vfb according to the negative peak value of the drain-source voltage Vds2 of the secondary side switch S2. Because the load state signal Vfb is proportional to the peak current Ipk of the primary side switch S1, and the formula below is satisfied:

$$Vfb = K1 \times Rcs \times Ipk$$

$$Isk = n \times Ipk$$

$$Vds2min = Rds \times Isk$$

In the above three formulae, K1 is a coefficient, Rcs is sense resistor to detect the peak current of the primary side switch, n is the turn ratio of transformer 110, Rds is the on-resistance value of secondary side switch S2. Isk is the peak value of the secondary current Is. Ipk is the peak value of primary current Ip. Vds2min is the negative peak value of the drain-source voltage Vds2 of the secondary side switch S2. According to these formulae, the relationship between Vds2min and load state signal Vfb can be obtained:

$$V_{ds2min} = \frac{n}{K_1} \frac{R_{ds}}{R_{cs}} V_{fb}$$

Accordingly, the load detection circuit 120 can output the load state signal Vfb according to the negative peak value of the drain-source voltage Vds2 of the secondary side switch S2.

As shown in FIG. 9, since the secondary side switch S2 and the primary side switch S1 starts to oscillate at the same time, the time point when the drain-source voltage Vds2 of the secondary side switch S2 is at the peak of resonance is the same as the time point when the drain-source voltage Vds1 of the primary side switch S1 is at a valley. So the control circuit 140 can detect whether the drain-source voltage Vds2 of the secondary side switch S2 is at the peak of the resonance through a peak detection circuit 142. The control circuit 140 outputs the first control signal Sc1 to turn on the primary side switch S1 when the drain-source voltage of the secondary side switch S2 is at the peak of the resonance after the blanking time starting from the reference time point.

Referring to FIG. 10, FIG. 10 is a flowchart illustrating a control method in some embodiments of the present disclosure. For ease and clarity of explanation, the following control method is described in conjunction with the embodiments shown in FIGS. 1, 6 and 8, but is not limited thereto. Anyone who is familiar with this skill, within the spirit and scope of the present disclosure, can make various changes and retouching.

First, in step S01, the load detection circuit 120 is configured to detect the load state, and outputs the load state signal Vfb correspondingly. The load state signal Vfb is configured to indicate the output power. In some embodiments, as shown in FIG. 1, the load detection circuit 120 detects the voltage of the two terminals of the load. In some embodiments, as shown in FIG. 8, the load detection circuit 120 detects the drain-source voltage Vds2 of the secondary side switch S2 to calculate the load state signal Vfb.

In step S02, the control circuit 140 is configured to receive the load state signal Vfb, and sets the blanking time according to the load state signal Vfb. The length of the blanking time can change with the load state, such as the heavy load state, the medium load state, light load state or every light load state.

In step S03, the state detection circuit 130 is configured to detect the reference time point. The reference time point is corresponding to the time point when the secondary current Is of the secondary winding M2 of the transformer 110 drops to zero. In some embodiments, as shown FIG. 1, when the secondary current Is becomes zero, the drain-source voltage Vds1 of the primary side switch S1 oscillates at the same time. Therefore, the state detection circuit 130 detects the drain-source voltage Vds1 of the primary side switch S1, and record the time point when the drain-source voltage Vds1 of the primary side switch S1 starts to oscillate as the reference time point. In some embodiments, as shown in FIG. 8, when the secondary current Is becomes zero, the drain-source voltage Vds2 of the secondary side switch S2 oscillates at the same time. Therefore, the state detection circuit 130 detects the drain-source voltage Vds2 of the secondary side switch S2, and records the time point when the drain-source voltage Vds2 of the secondary side switch S2 starts to oscillate as the reference time point.

In step S04, the control circuit 140 outputs the first control signal Sc1 to the primary side switch S1 so as to turn on or turn off the primary side switch S1, and the primary side switch S1 is turned on when the drain-source voltage Vds1 of the primary side switch S1 is at a valley after the blanking time starting from the reference time point. In some embodiments, as shown in FIG. 1, the control circuit 140 detects the time when the drain-source voltage Vds1 of the primary side switch S1 is at valley by the valley detection circuit 141. In some embodiments, as shown in FIG. 8 and FIG. 9, since the drain-source voltage Vds2 of the secondary side switch S2 also oscillates when the secondary current Is becomes to zero and the oscillating phase is opposite to the drain-source voltage Vds1 of the primary side switch S1, the control circuit 140 may detect the time point when the drain-source voltage Vds2 of the secondary side switch S2 is at the peak of the resonance and generates the first control signal Sc1 to turn on the primary side switch S1 after the blanking time starting from the reference time point.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A converter, comprising:
   a transformer comprising a primary winding and a secondary winding;
   a primary side switch electrically coupled to the primary winding and a primary ground terminal;
   a secondary side switch electrically coupled to the secondary winding and a load;
   a load detection circuit configured to detect a load state and correspondingly output a load state signal;
   a state detection circuit configured to record a reference time point; and
   a control circuit configured to output a control signal to turn on or turn off the primary side switch, wherein the control circuit is configured to set a blanking time according to the load state signal, such that the primary side switch is turned on when a drain-sauce voltage of the primary side switch is at a valley of a resonance after the blanking time starting from the reference time point, wherein the transformer further comprises a primary auxiliary winding, the state detection circuit is configured to detect a time point when a cross voltage of the primary auxiliary winding starts to oscillate, and sets the reference time point based on the time point.

2. The converter of claim 1, wherein the state detection circuit comprises a comparator; two terminals of the primary auxiliary winding are respectively connected to a first input terminal of the comparator and the primary ground terminal, when the cross voltage of the primary auxiliary winding starts to oscillate, the comparator correspondingly outputs a start signal to the control circuit to record the reference time point.

3. The converter of claim 2, wherein a second terminal of the comparator is connected to the primary ground terminal, so that the comparator outputs the start signal to the control circuit to record the reference time point when the cross voltage of the primary auxiliary winding starts to oscillate and cross zero voltage.

4. The converter of claim 2, wherein a second terminal of the comparator is connected to a reference voltage, so that the comparator outputs the start signal to the control circuit to record the reference time point when the cross voltage of the primary auxiliary winding starts to oscillate and cross the reference voltage.

5. The converter of claim 1, wherein a length of the blanking time is negative correlation with a magnitude of the load state signal.

6. The converter of claim 1, wherein the load detection circuit is configured to detect a negative peak value of a drain-source voltage of the secondary side switch, and outputs the load state signal according to the negative peak value of the drain-source voltage of the secondary side switch.

7. The converter of claim 1, wherein the control circuit detects whether a drain-source voltage of the secondary side switch is at a peak value of a resonance through a peak detection circuit, and the primary side switch is turned on when the drain-source voltage of the secondary side switch is at the peak value of the resonance after the blanking time starting from the reference time point.

8. A control method of a converter, comprising:
detecting a load state by a load detection circuit and correspondingly outputting a load state signal;
setting a blanking time by a control circuit according to the load state signal;
detecting a reference time point by a state detection circuit; and
outputting a control signal to a primary side switch of the converter by the control circuit so as to turn on the primary side switch when a drain-source voltage of the primary side switch is at a valley of a resonance after the blanking time starting from the reference time point; wherein the control method further comprises:
detecting a time point when a cross voltage of the a primary auxiliary winding of a transformer starts to oscillate; and,
setting the reference time point based on the time point.

9. The control method of claim 8, further comprising:
outputting a start signal to the control circuit to record the reference time point by a comparator when detecting an oscillation of the cross voltage of the primary auxiliary winding of the transformer of the converter.

10. The control method of claim 8, wherein the comparator outputs the start signal to the control circuit when the cross voltage of the primary auxiliary winding starts to oscillate and cross zero.

11. The control method of claim 8, wherein the comparator outputs the start signal to the control circuit when the cross voltage of the primary auxiliary winding starts to oscillate and cross a reference voltage.

12. The control method of claim 8, wherein a length of the blanking time is negative correlation with a magnitude of the load state signal.

13. A converter, comprising:
a transformer comprising a primary winding and a secondary winding;
a primary side switch electrically coupled to the primary winding and a primary ground terminal;
a secondary side switch electrically coupled to the secondary winding and a load;
a load detection circuit configured to detect a load state and correspondingly output a load state signal;
a state detection circuit configured to record a reference time point; and
a control circuit configured to output a control signal to turn on or turn off the primary side switch, wherein the control circuit is configured to set a blanking time according to the load state signal, such that the primary side switch is turned on when a drain-source voltage of the secondary side switch is at a peak value of a resonance after the blanking time starting from the reference time point, wherein the state detection circuit is configured to detect a time point when the drain-source voltage of the secondary side switch starts to oscillate, and sets the reference time point based on the time point.

14. The converter of claim 13, wherein the load detection circuit is configured to detect a negative peak value of the drain-source voltage of the secondary side switch, and outputs the load state signal according to the negative peak value of the drain-source voltage of the secondary side switch.

15. The converter of claim 13, wherein the control circuit detects whether the drain-source voltage of the secondary side switch is at the peak value of the resonance through a peak detection circuit, and the primary side switch is turned on when the drain-source voltage of the secondary side switch is at the peak value of the resonance after the blanking time starting from the reference time point.

16. The converter of claim 13, wherein a length of the blanking time is negative correlation with a magnitude of the load state signal.

17. A control method of a converter, comprising:
detecting a load state by a load detection circuit and correspondingly outputting a load state signal;
setting a blanking time by a control circuit according to the load state signal;
recording a reference time point by a state detection circuit; and
outputting a control signal to a primary side switch of the converter by the control circuit so as to turn on the primary side switch when a drain-source voltage of the secondary side switch is at a peak value of a resonance after the blanking time starting from the reference time point; wherein the control method further comprises:
detecting the drain-source voltage of a secondary side switch of a secondary side rectifier circuit of the converter by the state detection circuit; and recording the reference time point based on a time point when the drain-source voltage of the secondary side switch starts to oscillate.

* * * * *